United States Patent
Peczalski

(10) Patent No.: US 9,450,391 B2
(45) Date of Patent: Sep. 20, 2016

(54) OPTIMIZED CURRENT BUS

(71) Applicant: Honeywell International Inc., Morristown, NJ (US)

(72) Inventor: Andy Peczalski, Eden Prarie, MN (US)

(73) Assignee: Honeywell International Inc., Morris Plains, NJ (US)

( * ) Notice: Subject to any disclaimer, the term of this patent is extended or adjusted under 35 U.S.C. 154(b) by 32 days.

(21) Appl. No.: 14/599,851

(22) Filed: Jan. 19, 2015

(65) Prior Publication Data

US 2015/0236493 A1    Aug. 20, 2015

Related U.S. Application Data

(60) Provisional application No. 61/940,648, filed on Feb. 17, 2014.

(51) Int. Cl.
*H02G 5/02* (2006.01)
*G01R 15/18* (2006.01)

(52) U.S. Cl.
CPC ............... *H02G 5/02* (2013.01); *G01R 15/18* (2013.01)

(58) Field of Classification Search
USPC ........................................................ 174/68.2
See application file for complete search history.

(56) References Cited

U.S. PATENT DOCUMENTS

| | | |
|---|---|---|
| 7,057,485 B2 | 6/2006 | Preusse et al. |
| D545,304 S | 6/2007 | Sergi |
| 8,003,894 B2 * | 8/2011 | Fazakas .................. H01R 4/02 |
| | | 174/260 |
| 8,580,427 B2 * | 11/2013 | Oya ........................ H01M 2/30 |
| | | 429/160 |
| 2010/0026286 A1 | 2/2010 | Koss et al. |
| 2013/0149919 A1 | 6/2013 | Lee et al. |

FOREIGN PATENT DOCUMENTS

| | | |
|---|---|---|
| DE | 10054016 A1 | 5/2000 |
| DE | 10243645 A1 | 6/2004 |
| DE | 102012102270 A1 | 9/2012 |
| WO | WO-01/67117 A2 | 9/2001 |
| WO | WO-2015/030871 A1 | 3/2015 |
| WO | WO-2015/030872 A1 | 3/2015 |

OTHER PUBLICATIONS

"European Application Serial No. 15153650.5, Response filed Feb. 10, 2016 to Extended European Search Report mailed Jul. 7, 2015", 11 pgs.

"European Application Serial No. 15153650.5, Extended European Search Report mailed Jul. 7, 2015", 8 pgs.

* cited by examiner

*Primary Examiner* — Dhirubhai R Patel

(74) *Attorney, Agent, or Firm* — Schwegman Lundberg & Woessner, P.A.

(57) ABSTRACT

A current bus that includes an opening that extends from one side of the current bus to an opposing side of the current bus. The opening changes in size as the opening extends from one side of the current bus to the opposing side of the current bus. The opening may include a first diameter and a second diameter that is different than the first diameter. The opening may include a first thickness at the first diameter of the opening which may be much smaller than a second thickness of the current bus. A high accuracy current measurement of the current bus may require that the magnetic field profile of the current bus within the opening be non-linear (e.g., 3rd order polynomial with the highest value of the 3rd degree coefficient).

11 Claims, 7 Drawing Sheets

|        | NO LIP   | 2 mm     | 4 mm     | 6 mm     | 8 mm     | 10 mm    | 12 mm    |
|--------|----------|----------|----------|----------|----------|----------|----------|
| Ø 0.4" | 8.65E-04 | 9.34E-04 | 9.61E-04 | 9.85E-04 | 1.03E-03 | 1.11E-03 | 1.27E-03 |
|        | 9.75E-07 | 1.05E-05 | 1.51E-05 | 1.78E-05 | 2.16E-05 | 2.62E-05 | 3.41E-05 |
| Ø 0.6" | 7.60E-04 | 7.55E-04 | 7.49E-04 | 7.57E-04 | 7.94E-04 | 9.03E-04 | 1.31E-03 |
|        | 2.07E-06 | 4.19E-06 | 5.66E-06 | 7.04E-06 | 8.60E-06 | 1.13E-05 | 2.25E-05 |
| Ø 0.8" | 6.61E-04 | 6.38E-04 | 6.27E-04 | 6.40E-04 | 7.21E-04 | 9.76E-04 | 1.02E-03 |
|        | 2.03E-06 | 2.44E-06 | 3.64E-06 | 3.55E-06 | 5.88E-06 | 1.07E-05 | 1.09E-05 |
| Ø 1.0" | 5.76E-04 | 5.53E-04 | 5.50E-04 | 6.22E-04 | 7.75E-04 | 8.05E-04 | 8.22E-04 |
|        | 1.92E-06 | 2.03E-06 | 2.38E-06 | 3.99E-06 | 7.93E-06 | 6.77E-06 | 1.43E-06 |
| Ø 1.2" | 5.07E-04 | 4.92E-04 | 6.01E-04 | 6.45E-04 | 6.63E-04 | 6.75E-04 | 6.79E-04 |
|        | 1.23E-06 | 1.75E-06 | 4.64E-06 | 4.40E-06 | 4.67E-06 | 2.46E-06 | 4.66E-06 |

THERMAL SIMULATION
AMBIENT TEMP = 30°C
40" LONG BUSBAR
30°C HEAT SINK AT BOTH ENDS

10 W/m$^2$·K: 32.11°C
20 W/m$^2$·K: 31.65°C
10 W/m$^2$·K, NO HOLE: 31.79°C
20 W/m$^2$·K, NO HOLE: 31.37°C

RESISTANCE (40" LENGTH):
WITH HOLE: 2.51E-5 Ω
WITHOUT HOLE: 2.34E-5 Ω

*FIG. 2*

|       | NO LIP   | 4 mm     | 8 mm     | 12 mm    | 16 mm    | 20 mm    | 24 mm    | 28 mm    | 32 mm    |
|-------|----------|----------|----------|----------|----------|----------|----------|----------|----------|
| Ø 1.5" | 9.37E-04 | 8.88E-04 | 8.41E-04 | 7.96E-04 | 7.61E-04 | 7.30E-04 | 7.08E-04 | 6.97E-04 | 6.98E-04 |
|       | 9.46E-07 | 8.88E-07 | 2.22E-07 | 1.73E-07 | -5.44E-07 | 2.68E-07 | 1.95E-06 | 7.59E-07 | 1.46E-06 |
| Ø 2.0" | 8.19E-04 | 7.68E-04 | 7.22E-04 | 6.83E-04 | 6.50E-04 | 6.26E-04 | 6.10E-04 | 6.06E-04 | 6.24E-04 |
|       | 9.11E-07 | 1.04E-06 | 4.41E-07 | 6.39E-07 | 1.21E-06 | 2.11E-07 | 7.48E-07 | 1.03E-06 | 5.93E-07 |
| Ø 2.5" | 7.17E-04 | 6.71E-04 | 6.31E-04 | 5.98E-04 | 5.72E-04 | 5.54E-04 | 5.47E-04 | 5.66E-04 | 8.15E-04 |
|       | 4.69E-07 | 1.98E-07 | 1.22E-06 | 3.83E-07 | 5.30E-07 | -3.14E-07 | 6.29E-07 | -8.06E-08 | -4.78E-08 |
| Ø 3.0" | 6.32E-04 | 5.92E-04 | 5.60E-04 | 5.32E-04 | 5.13E-04 | 5.06E-04 | 5.38E-04 | 7.25E-04 | 7.69E-04 |
|       | -3.11E-07 | 3.91E-07 | -4.66E-07 | 9.01E-07 | 2.07E-07 | 1.94E-07 | -5.36E-07 | 2.93E-06 | -1.40E-06 |
| Ø 3.5" | 5.61E-04 | 5.29E-04 | 5.02E-04 | 4.82E-04 | 4.75E-04 | 5.99E-04 | 6.36E-04 | 6.62E-04 | 6.78E-04 |
|       | -1.31E-07 | -3.15E-07 | 1.44E-07 | -1.48E-07 | 1.44E-07 | -5.09E-06 | 4.70E-06 | -1.53E-07 | -1.79E-06 |

THERMAL SIMULATION
AMBIENT TEMP = 30°C
40" LONG BUSBAR
30°C HEAT SINK AT BOTH ENDS

10 $W/m^2 \cdot K$: 34.91°C
20 $W/m^2 \cdot K$: 34.36°C
10 $W/m^2 \cdot K$, NO HOLE: 32.81°C
20 $W/m^2 \cdot K$, NO HOLE: 32.49°C

RESISTANCE (40" LENGTH):
WITH HOLE: 3.4663E-6 Ω
WITHOUT HOLE: 2.6255E-6 Ω

*FIG. 6*

OPTIMIZED CURRENT BUS

CROSS REFERENCE TO RELATED APPLICATIONS

This application claims the benefit of priority to U.S. Provisional Patent Application Ser. No. 61/940,948, filed on Feb. 17, 2014, which application is incorporated herein by reference in its entirety.

BACKGROUND

Small and accurate current sensors are required over wide nominal current range for monitoring batteries, regulating current of solar or wind generators, controlling electrical motors.

BRIEF DESCRIPTION OF THE DRAWINGS

FIG. 2 shows (i) a magnetic field strength; and (ii) a quadratic coefficient (i.e., a measure of nonlinearity) in the center of the opening in the current bus shown in FIG. 1.

FIG. 6 shows (i) a magnetic field strength; and (ii) a quadratic coefficient (i.e., a measure of nonlinearity) in the center of the opening in the current bus shown in FIG. 5.

The following detailed description includes references to the accompanying drawings, which form a part of the detailed description. The drawings show, by way of illustration, specific embodiments in which the invention may be practiced. These embodiments

DETAILED DESCRIPTION

The following detailed description includes references to the accompanying drawings, which form a part of the detailed description. The drawings show, by way of illustration, specific embodiments in which the invention may be practiced. These embodiments, which are also referred to herein as "examples," are described in enough detail to enable those skilled in the art to practice the invention. The embodiments may be combined, other embodiments may be utilized, or structural, and logical changes may be made without departing from the scope of the present invention. The following detailed description is, therefore, not to be taken in a limiting sense, and the scope of the present invention is defined by the appended claims and their equivalents.

In this document, the terms "a" or "an" are used to include one or more than one and the term "or" is used to refer to a nonexclusive "or" unless otherwise indicated. In addition, it is to be understood that the phraseology or terminology employed herein, and not otherwise defined, is for the purpose of description only and not of limitation.

Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference should be considered supplementary to that of this document; for irreconcilable inconsistencies, the usage in this document controls.

The electric current being carried by a current bus may be measured by monitoring the electric field profile inside an opening in the current bus. As used herein, "current bus" refers to "current bus bar", or "bus bar", or other means of delivering current.

Figure 1:
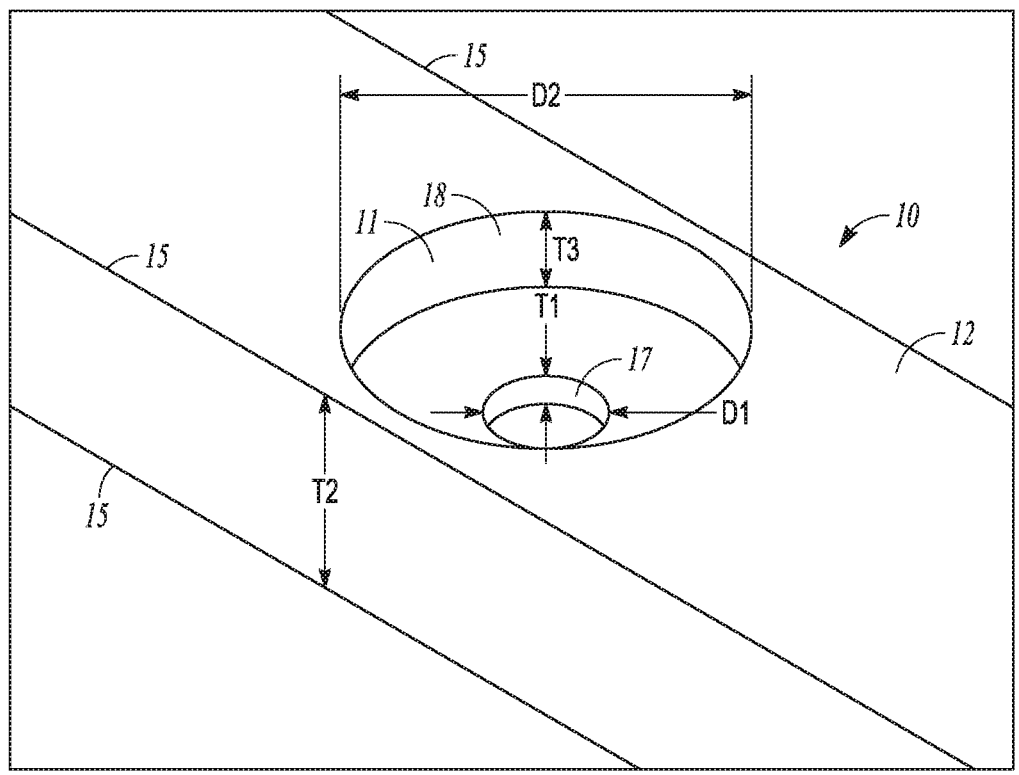
FIG. 1 shows an example current bus.
Figure 5:
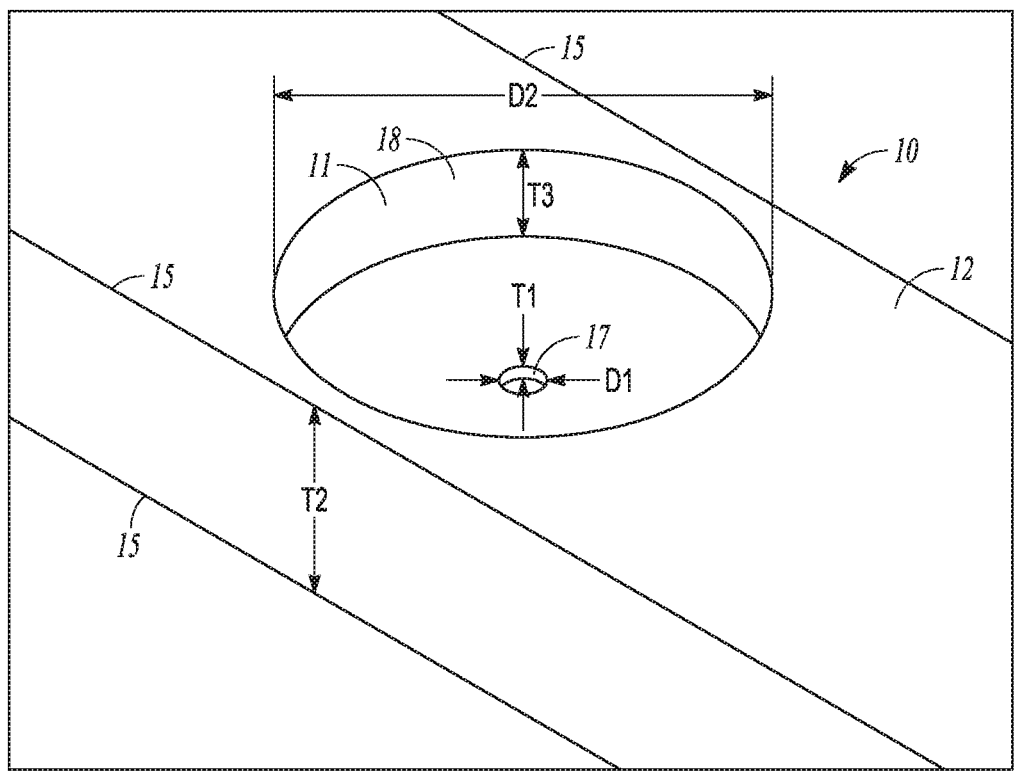
FIG. 5 shows another example current bus.

FIG. 1 shows an example current bus 10 for carrying 500 A. FIG. 5 shows an example current bus 10 for carrying 5000 A. The current bus 10 includes an opening 11 that extends from one side 12 of the current bus 10 to an opposing side (not visible in FIGS. 1 and 5) of the current bus 10. The opening 11 changes in size as the opening 11 extends from one side 12 of the current bus 10 to the opposing side of the current bus 10.

FIG. 1 shows the opening 11 as being circular. However, in some forms, the opening 11 may change in shape as the opening 11 extends from one side 12 of the current bus 10 to the opposing side of the current bus 10.

As shown in FIG. 1, the opening 11 may include a first portion 17 that has a first diameter D1 and a second portion 18 that has a second diameter D2 that is different than the first diameter D1. As an example, the first diameter D1 may be sized based on an amount of current that the current bus 10 is projected to carry, and/or the second diameter D2 may be sized based on the amount of current that the current bus 10 is projected to carry.

As shown in FIG. 1, the first portion 17 of the opening 11 may include a first thickness T1 at the diameter D1 of the opening 11 which may be much smaller than a second thickness T2 of the current bus 10. In addition, the first portion 18 of the opening 11 may include a third thickness T3 at the second diameter D2 of the opening 11 which may be much larger than the first thickness T1 at the first diameter D1 of the opening 11. As an example, the first thickness T1 may be less than 20% of the size of the third thickness T3.

A high accuracy current measurement of the current bus 10 may require that the magnetic field profile of the current bus 10 within the opening 11 be non-linear (e.g., 3rd order polynomial with the highest value of the 3rd degree coefficient). The first diameter D1 should be as small as possible (e.g., 0.4 inch) for fitting a current sensor in the opening 11 since the smaller diameter provides the largest nonlinearity and smallest magnetic field.

In order to achieve large 3rd degree coefficient the first diameter D1 should be as thin as practically feasible, e.g., 0.1 inch for assembling and positioning of the magnetic field sensor precisely in the center as required for high accuracy sensing. The relatively small thickness T1 at the first diameter D1 of the opening 11 may be comparable to the skin effect depth for the frequencies of interest and therefore the current crowding towards the skin will be minimal.

The second diameter D2 of the opening 11 may extend almost to the edge of the current bus 10, but leave a small mechanically robust (e.g., 0.1-0.3 inch ridge) for minimizing the magnetic field and reducing the impact of the skin effect. In some forms, the current bus 10 may be at least 5 times wider than thicker for better current measurement.

The current bus 10 may have a rectangular cross section. In some forms, the edges 15 of the current bus may not be uniformly shaped (not shown in FIGS. 1 and 5). In other forms, the edges 15 of the current bus may rounded or chamfered (not shown in FIGS. 1 and 5). A short section of the current bus 10 may also be used with rectangular or other shapes and include holes at one or both ends as well as additional holes for attaching a current sensor.

Figure 7:
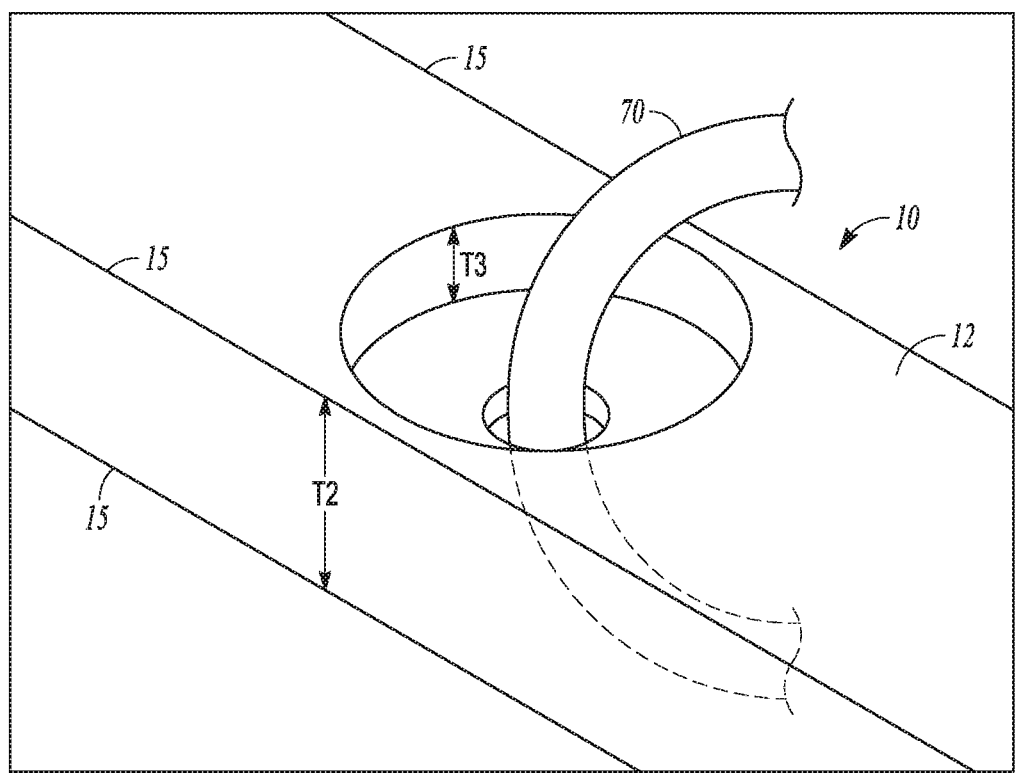
FIG. 7 shows the example current bus of FIG. 1 with a current sensor extending through the opening in the current bus.

FIG. 7 shows the current bus 10 of FIG. 1 where the current bus includes an example current sensor 70 that may or may not extend through the opening 11. In other forms, the current sensor 70 may be merely located within the opening 11. In other forms, the current sensor 70 may be attached to the current bus 10. In other forms, the current sensor 70 may be attached to an electronic package that extends in to the opening 11 in the current bus 10. Although only a portion of the current sensor 70 is shown in FIG. 7, it should be noted that the current sensor 70 may be circular, or any shape that facilitates measuring current being carried by the current bus 10. It should be noted that any type of current sensor 20 that is known now, or discovered in the future, may be used to measure the magnetic field in the center of the opening 11.

The magnetic field in the opening 11 may have to be relatively low (e.g., 10 Oe) in order to efficiently close the loop of the current sensor 70 that measures the current being carried by the current bus 10 and thereby nullifying the effects of the magnetic field produced by the current bus 10. The example current busses 10 described herein may modify the magnetic profile of the openings 11 in the current busses 10 in three directions (e.g., vertical, horizontal and along the current flow).

In addition, the impact of the skin effect on the current distribution has to be small. Skin effect typically pushes the current towards the exterior of the conductor as the frequency of the current increases. Therefore, if the first thickness T1 is comparable to the skin depth at the maximum operation frequency (e.g. 150 kHz), then the current distribution may not change significantly in that part of the current bus 10.

FIGS. 2 and 6 show (i) a magnetic field strength; and (ii) a quadratic coefficient (i.e., a measure of nonlinearity) in the center of the opening 11 for current levels of 500 A and 5000 A respectively in the respective current busses 10 shown in FIGS. 1 and 5. A comparison between the magnetic field profile with and without the lip is also shown. FIGS. 2 and 6 illustrate optimizing the current bus 10 opening 11 diameters D1, D2 and thicknesses T1, T3 such that the quadratic coefficient is maximized without exceeding a magnetic field strength of 10 Oe in the center of the opening 11. It should be noted FIGS. 2 and 6 utilize Tesla as a measurement instead of Oersted.

The results were obtained by 3-dimensional finite element simulations. The simulation of the increase of the resistance and temperature drop with and without an opening 11 in the current bus 10 are also shown since the resistance may be very low and the temperature increase may be kept below 5 degrees Centigrade.

Figure 3A:
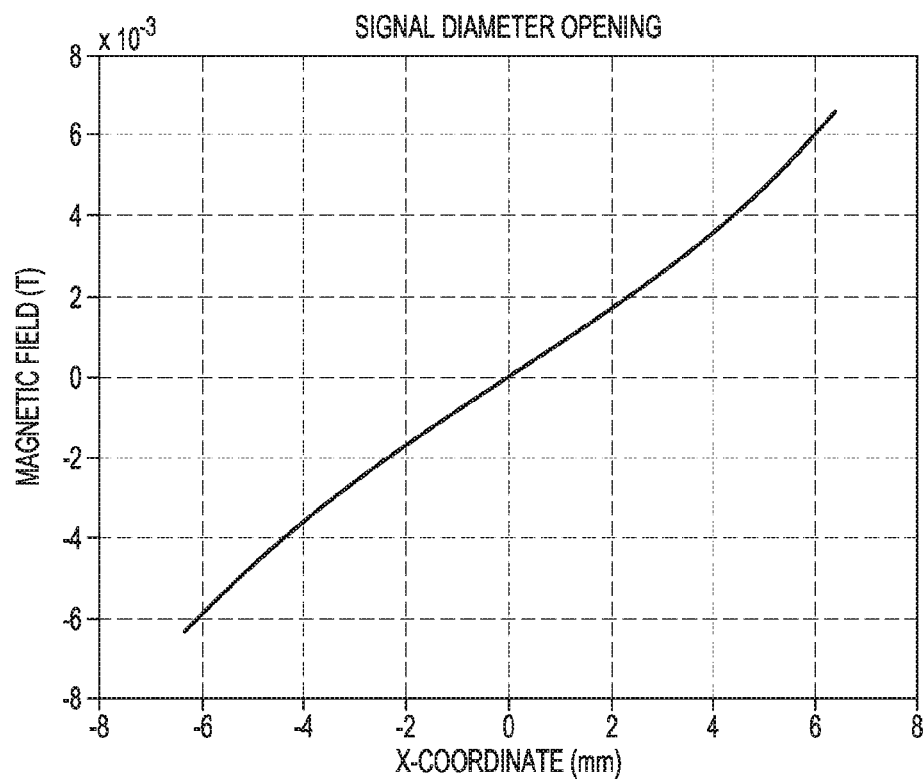
FIG. 3A and FIG. 3B show a comparison of the magnetic field in an opening of a current bus when the current bus has single diameter (FIG. 3A) and two diameters (FIG. 3B).
Figure 3B:
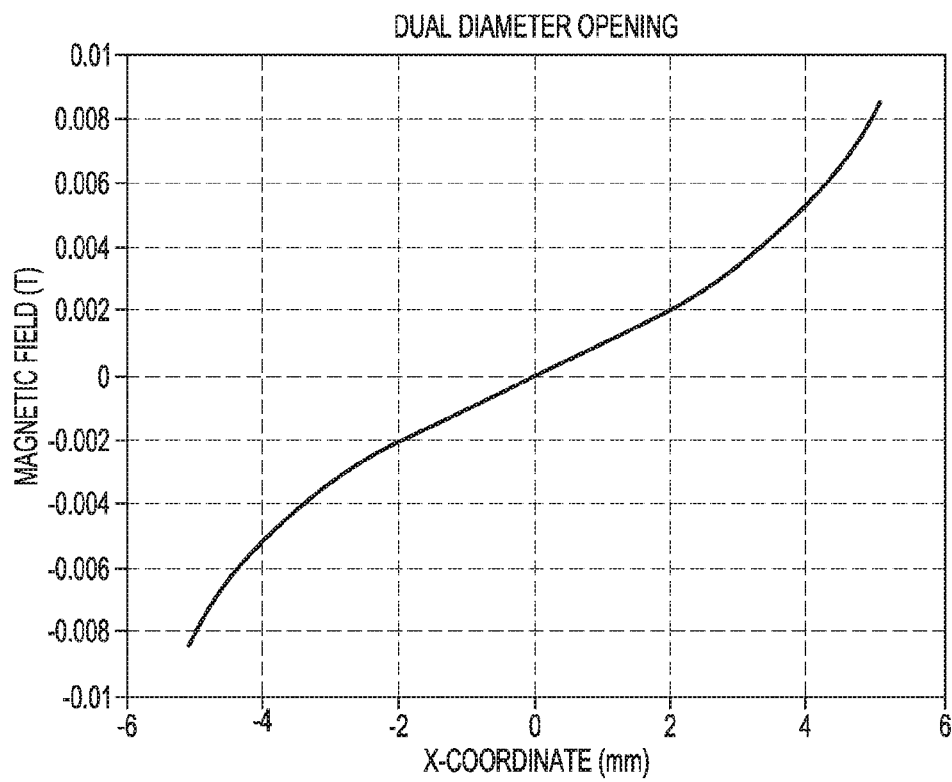
Figure 4A:
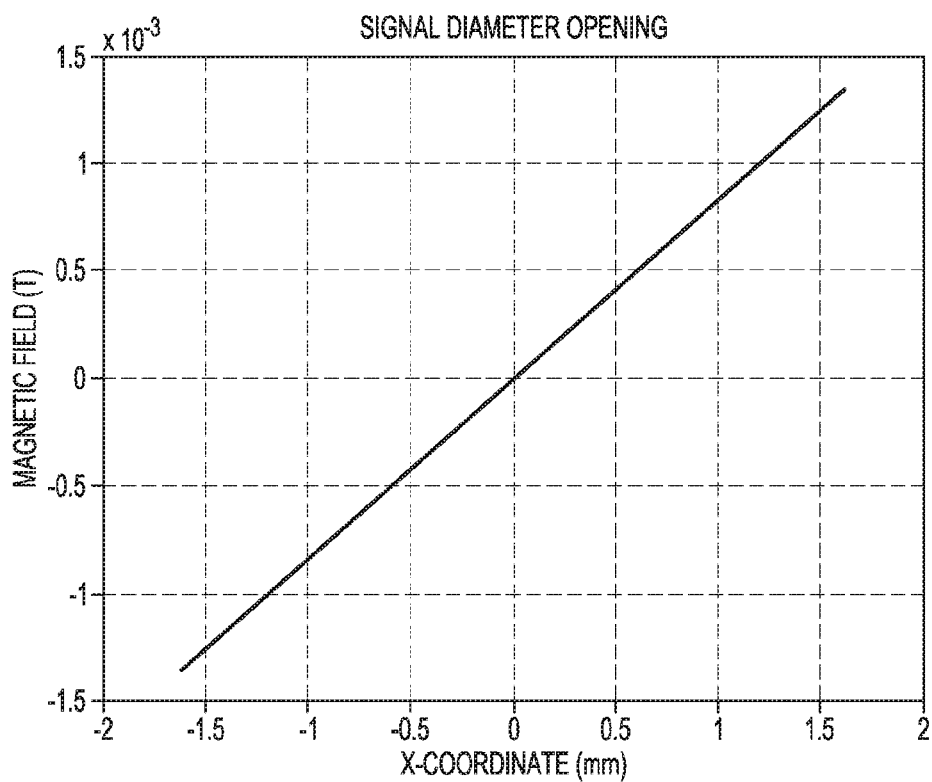
FIG. 4A and FIG. 4B show a magnified comparison of the graphs shown in FIGS. 3A and 3B showing a magnetic field in the small section centered in an opening of a current bus when the current bus has single diameter (FIG. 4A) and two diameters (FIG. 4B).
Figure 4B:
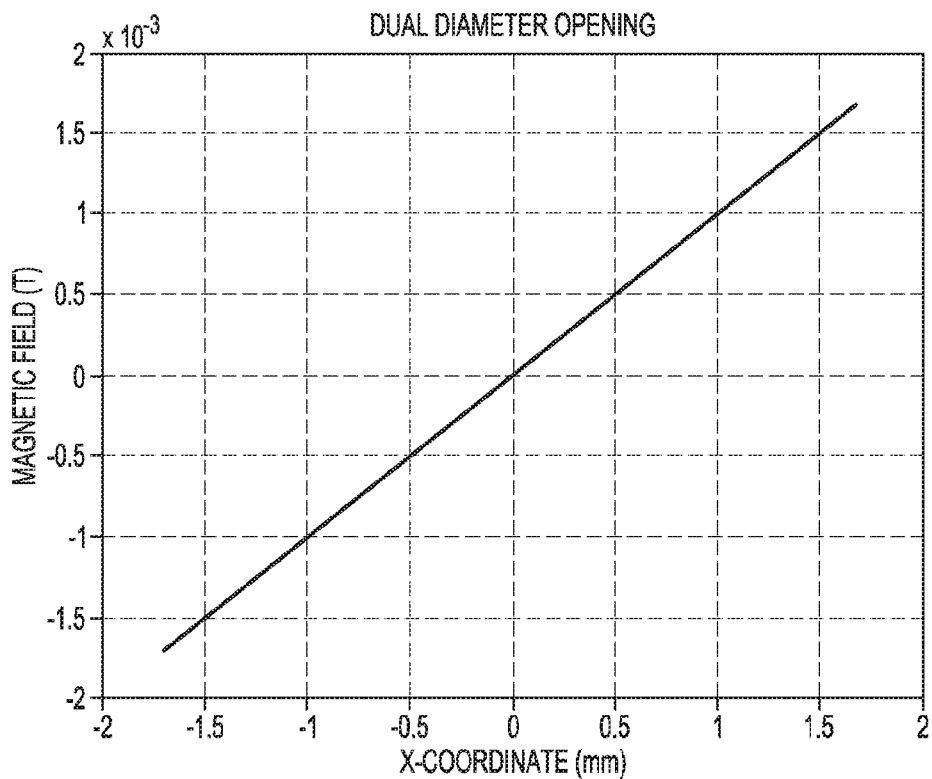

A comparison of FIG. 3A and FIG. 3B shows that providing a lip in the current bus may provide a more non-linear magnetic field in the current bus 10 (e.g., 3rd order polynomial with the highest value of the 3rd degree coefficient). It should be noted that the comparison of FIG. 4A and FIG. 4B does not show the nonlinearity difference between having a lip and not having a lip (i.e., the difference is not visible to the naked eye in the center part of the curve). The numerical value of the quadratic coefficient may be almost three times larger when a lip is included in the current bus 10.

While there has been described herein the principles of the application, it is to be understood by those skilled in the art that this description is made only by way of example and not as a limitation to the scope of the application. Accordingly, it is intended by the appended claims, to cover all modifications of the application which fall within the true spirit and scope of the application.

The invention claimed is:

1. A current bus comprising an opening that extends from one side of the current bus to an opposing side of the current bus, wherein the opening changes in size as the opening extends from one side of the current bus to an opposing side of the current bus, wherein the opening includes a first portion having a first thickness and a first diameter and the current bus has a second thickness that is larger than the first thickness, wherein the opening further includes a second portion having a third thickness and a second diameter that is larger than the first diameter, wherein the second thickness is larger than the third thickness and the first thickness and the third thickness are equal to the second thickness.

2. The current bus of claim 1, wherein the opening in the current bus bar is configured to modify a magnetic field profile that is generated inside the opening in the current bus when the current bus conducts current.

3. The current bus of claim 2, wherein the magnetic field profile that is generated inside the opening is non-linear.

4. The current bus of claim 3, wherein the nonlinear magnetic field profile that is generated inside the opening is a 3rd order polynomial with the highest value of the 3rd degree coefficient.

5. The current bus of claim 1, further comprising a current sensor extending through the opening in the current bus.

6. The current bus of claim 1, wherein the second diameter is at least twice as large as the first diameter.

7. The current bus of claim 1, wherein the second diameter is at least four times as large as the first diameter.

8. The current bus of claim 1, wherein the second thickness is at least twice as large as the first thickness.

9. The current bus of claim 1, wherein the second thickness is at least four times as large as the first thickness.

10. The current bus of claim 1, wherein the current bus has a width that is at least twice as large as the second dimeter.

11. The current bus of claim 1, wherein the current bus has a width that is less than 10 percent larger than larger than the second dimeter.

* * * * *